United States Patent [19]
Frey

[11] Patent Number: 5,967,578
[45] Date of Patent: Oct. 19, 1999

[54] TOOL FOR THE CONTACT-FREE SUPPORT OF PLATE-LIKE SUBSTRATES

[75] Inventor: Helmut Frey, Ferlach, Austria

[73] Assignee: Sez North America, Inc., Phoenix, Ariz.

[21] Appl. No.: 09/087,359

[22] Filed: May 29, 1998

[51] Int. Cl.⁶ .................................................. B25J 15/06
[52] U.S. Cl. ........................ 294/64.3; 414/941; 901/40
[58] Field of Search .................................... 294/64.1–64.3; 414/941; 901/40; 271/97, 98, 195

[56] References Cited

U.S. PATENT DOCUMENTS

| | | | |
|---|---|---|---|
| 3,438,668 | 4/1969 | Olsson et al. | 294/64.3 |
| 3,523,706 | 8/1970 | Logue | 294/64.3 |
| 3,539,216 | 11/1970 | Forcier | 294/64.3 |
| 4,002,254 | 1/1977 | Olofsen | 414/941 |
| 4,118,058 | 10/1978 | Rahn et al. | 294/64.3 |
| 5,324,155 | 6/1994 | Goodwin et al. | 294/64.3 |
| 5,492,566 | 2/1996 | Sumnitsch | 294/64.2 |

*Primary Examiner*—Dean J. Kramer
*Attorney, Agent, or Firm*—John F. A. Earley; John F. A. Earley, III; Harding, Earley, Follmer & Frailey

[57] ABSTRACT

The invention relates to a tool for the free support of plate-like substrates, comprising a flat plate-like body with at least one supporting surface wherein at least one gas channel is provided within the body, extending from an outer gas supply end to an inner gas discharge end, the gas discharge end being in fluid communication with a gas distribution chamber, through which gas passes into a dynamically balanced gas slit being arranged radially with respect to the gas distribution chamber predominantly parallel to the supporting surface and opening into the supporting surface at its outer end at an angle >90 and <180°.

12 Claims, 2 Drawing Sheets

TOOL FOR THE CONTACT-FREE SUPPORT OF PLATE-LIKE SUBSTRATES

TECHNICAL FIELD OF THE INVENTION

The invention relates in general to a tool for the contact-free support of plate-like like substrates such as semiconductor wafers. Insofar as the following description refers to wafers this will include any types of plate-like like substrator, like compact discs etc.

BACKGROUND OF THE INVENTION

In semiconductor fabrication it is desirable to employ automated handling on the semiconductor wafers for efficient processing. Said wafers are typically retrieved from and loaded back into a carrier holding a number of wafers. The space available between adjacent wafers in the carrier is very small.

Insofar any handling apparatus must be constructed with a flat and elongated equipment (tool) to be fed in or retracted from said carrier.

At the same time, while the wafers being moved, the wafers must be held securely, but gently and are not allowed to interfere with adjacent wafers in the cassette (carrier). Any contact with the surfaces of the wafers should be avoided.

An apparatus with piezoelectric grippers is known from EP 0 810 636 A2.

EP 0 778 611 A2 discloses an end effector for a wafer transfer device, comprising a pocket allowing the end effector to contact only the edges of the wafer.

U.S. Pat. No. 4,118,058 discloses a tool for the contact-free support of discs by gas streams impinging on the discs when emerging from the supporting face of the tool at an acute angle to the disc surface.

A disadvantage of the known tool is based on the fact that especially thin wafers are deformed during transport.

The same is true with respect to the pick-up device for lifting and moving semiconductor wafers according to U.S. Pat. No. 4,002,254. The pick-up device has a working member, the underside of which forms a flat suspension surface incorporating the orifice of a single inclined jet through which air is ejected in an unbalanced flow towards a limiting surface at one end of the suspension surface.

OBJECTS OF THE INVENTION

It is therefore an object of the present invention to provide an improved tool for contact-free handling and transporting of plate-like substrates.

It is a further object of the invention to provide a tool which does not require any contact with any wafer front or back surfaces thus eliminating corresponding contamination issues.

SUMMARY OF THE INVENTION

The aforementioned and other objects are accomplished, according to the present invention, by a tool for the contact free support (handling and transporting) of plate-like substrates, comprising a flat body and at least one supporting surface, wherein at least one gas channel is provided within said body, extending from an outer gas supply end to an inner gas discharge end, said gas discharge end being in fluid communication with a gas distribution chamber, through which gas passes into a dynamically balanced gas slit being arranged predominantly parallel tea the supporting surface and extending into the said supporting surface with its outer periphery at an angle $\alpha$ >90 and <180°.

This tool (apparatus) provides a contact free support position for a wafer without any danger of deformation of the said wafer.

While taking over the so-called Bernoulli principle for lifting and moving a plate-like substrate, in particular a semiconductor wafer, without physically contacting said workpiece, the tool has been optimized insofar as according to the design of said tool the wafer may be placed contact-free with a constant distance between its bottom face and the supporting surface. Accordingly any deformation of the wafer is avoided and in case a deformed wafer is placed onto said tool this wafer is flattened.

In constructing such a tool the main difficulty is that the tool must have a very limited height in order to be placed into a carrier, holding a number of wafers and retrieved therefrom.

Any direct link between the gas discharge end of the gas channel and the said gas slit will not lead to a gas flow out of said gas slit enabling the wafer to be hold exactly flat and parallel to the supporting surface. One reason for this is that because of the limited size of the tool inconsistencies may occur with respect to the gas flow in such cases.

According to the present invention a gas distribution chamber is provided between the said gas channel(s) and the dynamically balanced gas slit. This gas distribution chamber is responsible for a uniform distribution of the gas (air) before entering the gas slit.

Together with the dynamically balanced shape of the gas slit, which may be designed according to preferred embodiments as a circle or ring-like, the gas may leave the gas slit at its outer periphery under uniform pressure and flow rate thus optimizing the Bernoulli effect and insofar enabling a wafer to be held contact-free but at a defined and constant distance to the support surface.

Further the arrangement of the gas distribution chamber allows an eccentrical (space-saving) placement of the corresponding gas channel or gas channels. Further the gas channels may be arranged in a more or less identical plane with respect to the gas distribution chamber. By this feature the minimum height of the tool may be reduced further. The gas distribution chamber may have a height larger than the height of the gas slit. By this means the gas distribution is optimized before entering the gas slit and fed through said gas slit under higher pressure.

As pointed out above the gas distribution chamber may have a ring-like shape. Another embodiment provides a gas distribution chamber with a circular cross-section.

It is preferred to arrange the gas slit radially with respect to the gas distribution chamber.

The gas channel(s), the gas distribution chamber and the gas slit may be provided by different techniques. According to an embodiment the gas distribution chamber and the gas slit are provided between a surface of a cavity within said body and a corresponding surface of a plate-like cover placed within said cavity.

Insofar the tool is a two-piece tool, namely the body (with a cavity on at least one top surface) and a cover placed therein.

According to the shape of the gas slit the cavity as well as the cover have—as an example—a circular-, annular- or ring-shaped form, the diameter of the cavity being a bit larger than the diameter of the cover.

The cover may be fixedly secured to said body as will be further explained according to the attached drawings.

In order to provide a uniform height of the gas slit (a uniform distance between a bottom surface of the cover and the top surface of the cavity) spreaders may be arranged between the bottom surface of the cover and the top surface of the cavity. Said spreaders may be designed as radially extending ribs. They may be either part of the cover or of the body respectively.

In any case the spreaders will be of small size to avoid any disadvantages with respect to the gas flow.

According to another embodiment the tool further comprises at least two guiding means arranged at spaced locations to each other and extending vertically with respect to said supporting surface at a distance besides the gas slit.

These guiding means may be designed as a segment of a circle and provided with inclined faces opposite corresponding guiding means. Another embodiment provides guiding means designed like cylindrical pins or pins with frustroconical shape which may additionally have a cylindrical free end.

These guiding means are arranged in such a way as to provide "contact points" or "contact lines" for the outer periphery of the wafer to be treated.

If the guiding means are designed as pins three or four pins are preferred.

Because of the special construction the tool may even be provided with two supporting surfaces, i.e. including a second supporting surface opposite to the first supporting surface in order to use the tool on both sides.

In this embodiment the tool is provided of—course—with at least two gas channels, two distributions channels and two gas slits, wherein the arrangement of the second gas channel (s), the second distribution chamber and the second gas slit will be in accordance with the explanations before. A mirror-inverted design of the first and second gas transport means is possible.

Additional objects and advantages of the invention will be set force in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings illustrate embodiments of the invention and, together with the description, serve to explain the principals of the invention.

DETAILED DESCRIPTION OF THE DRAWINGS

Figure 1:
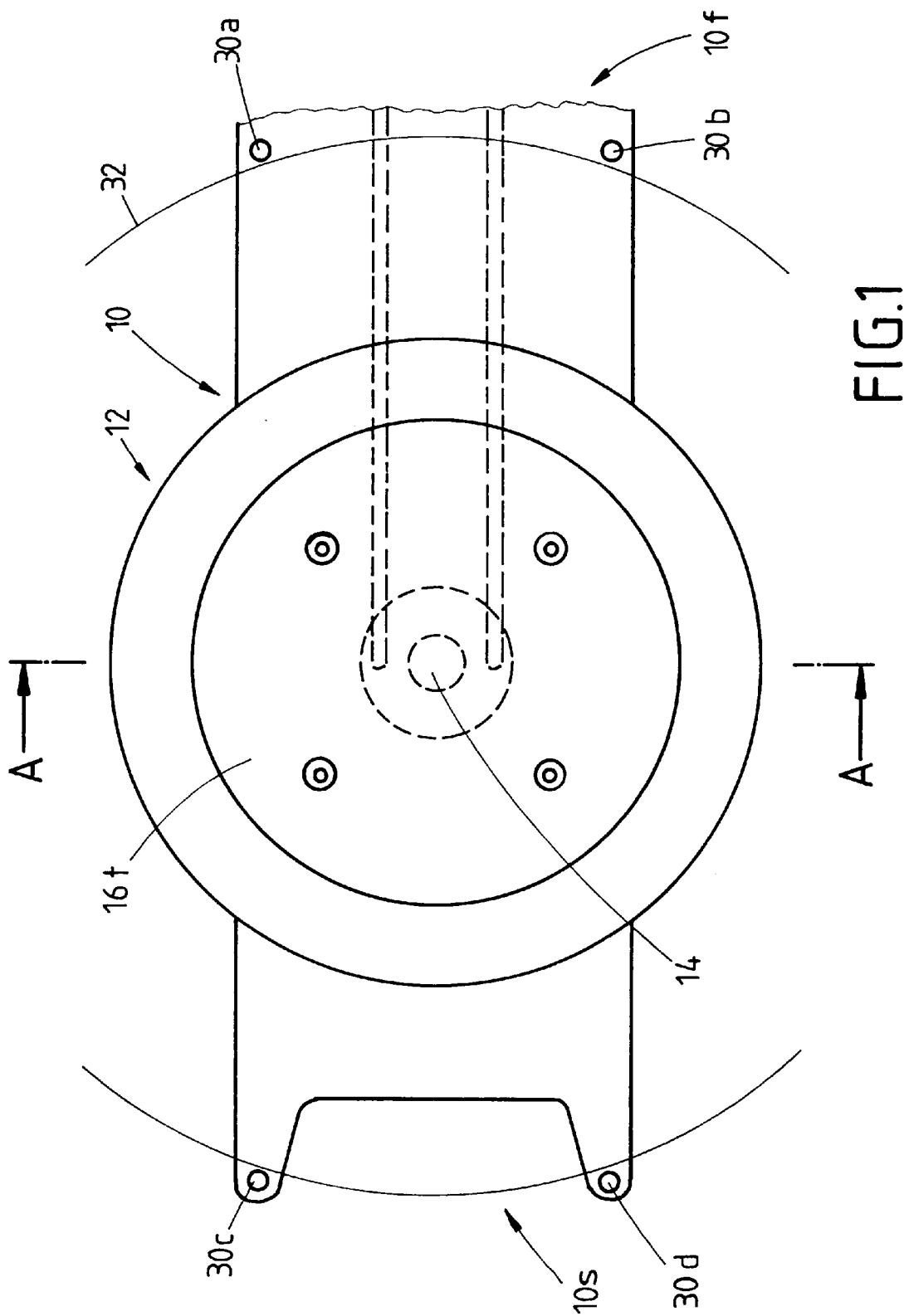
FIG. 1 is a top view of a tool for the contact-free support of a wafer in a first embodiment.

FIG. 1 is a partial top view on a tool for the contact-free support of a wafer.

It comprises a flat plate-like body 10 (of 3 mm thickness) including a circle portion 12 between its first end 10f and its free second end 10s. Body 10 is coupled to a robot (not shown) at its first end 10f.

Portion 12 of body 10 is provided with a center hole 14 and two circular cavities 16t and 16b in its top surface 18t and bottom surface 18b respectively.

Figure 2:
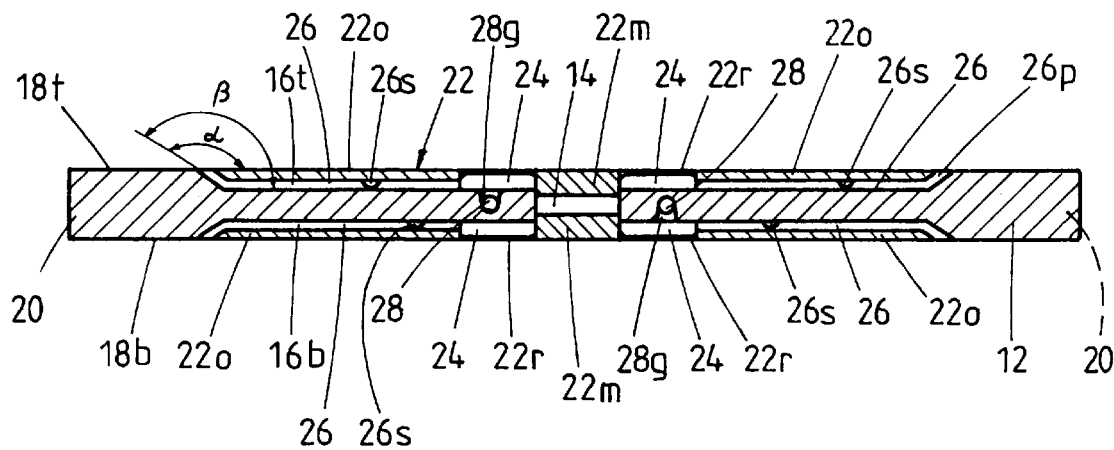
FIG. 2 is a sectional view of the tool according to FIG. 1 along line A—A.

The outer periphery of cavities 16t, 16b is inclined under an angle α of about 130° with respect to a center plane 20 as shown in FIG. 2.

A cover 22 of circular shape is fixedly secured by a middle portion 22m into the center whole 14 which is followed radially by a very thin ring-shaped portion 22r (of 0,3 mm thickness), which is then followed radially by a ring-shaped outer portion 22o (of 0,6 mm thickness), the outer edge of which being inclined under an angle β of about 135° with respect to center plane 20, thus providing a tapered gas discharge end of a gas slit 26 defined hereinafter.

As shown in FIG. 2 the ring-shaped outer portion 22o is of increased height (thickness) compared with ring-shaped portion 22r, thus providing a gas distribution chamber between the top surface of cavity 16t and the bottom surface of ring-shaped portion 22r which is of greater height than a ring-shaped gas slit 26 provided between the outer part of the top surface of cavity 16t and the ring-shaped outer portion 22o of cover 22.

A gas channel 28 is guided through body 10 (including circle portion 12) from a first (not shown) gas supply end (next to first end 10f of body 10) up to an area below gas distribution chamber 24 and provided with a gas discharge end 28g, vertically extending from the basic part of the gas channel 28 into the said gas distribution chamber 24.

By this means the gas passes through gas channel 28, gas discharge end 28g into gas distribution chamber 24 and thereafter through gas slit 26, leaving said gas slit 26 at its inclined outer periphery 26p.

Little knob-like spreaders 26s are arranged in gas slit 26.

According to FIGS. 1, 2 similar gas transport means are provided onto the other side of body 10, but mirror-inverted.

Before taking over a wafer gas flow is initiated and providing the so-called Bernoulli eftect when the tool has been placed at a short distance to said wafer.

For security reasons additional guiding pins 30a–30d are placed on the top and bottom surfaces 18t, 18b, arranged along a circle line and at spaced locations to each other (FIG. 1). The distance of pins 30a, 30d and 30b, 30c respectively is a bit larger or equals the diameter of the wafer to be treated, said wafer being partially shown in FIG. 1 by reference numeral 32.

Figure 3:
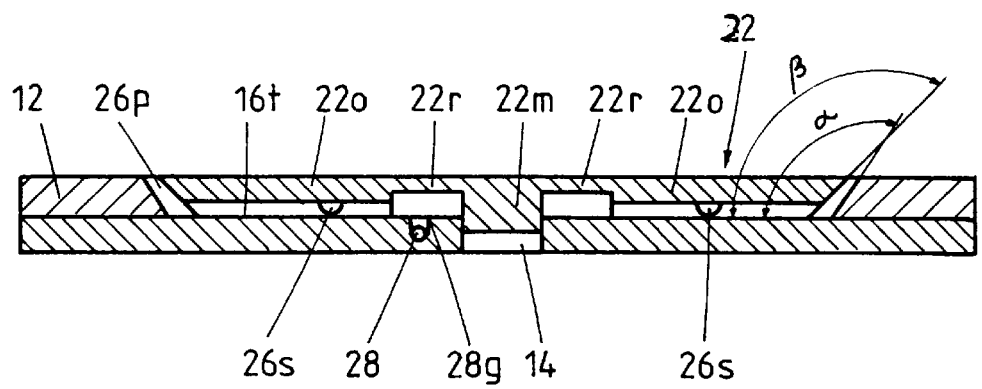
FIG. 3 is a similar sectional view of a second embodiment of a tool according to the invention.

FIG. 3 equals 2 with the proviso that body 10 is provided only along one of its surfaces with a cavity 16t and a cover 22. In this embodiment there is of course more space for the arrangement of the gas channel 28, the gas distribution chamber 24 and the gas slit 26 as well as said cover 22 if the total thickness of body 10 is unchanged compared with the embodiment of FIGS. 1, 2.

What is claimed is:

1. A tool for the contact free support of plate-like substrates, comprising a flat plate-like body with at least one supporting surface, wherein at least one gas channel is provided within said body, extending from an outer gas supply end to an inner gas discharge end, said gas discharge end being in fluid communication with a gas distribution chamber, through which gas passes into a dynamically balanced gas slit being arranged radially with respect to the gas distribution chamber, predominately parallel to the supporting surface and opening into the supporting surface at its outer end at an angle α >90 and <180°.

2. A tool according to claim 1, wherein the gas distribution chamber has a height being larger than the height of the gas slit.

3. A tool according to claim 1, wherein the gas distribution chamber has a ring-like shape.

4. A tool according to claim 1, wherein the gas distribution chamber and the gas slit are provided between a surface of a cavity within said body and a corresponding surface of a plate-like cover placed within said cavity.

5. A tool according to claim 4, wherein said cover is fixedly secured to said body.

6. A tool according to claim 1, wherein the discharge end of the gas channel is arranged eccentrically with respect to the gas slit.

7. A tool according to claim 1, wherein the gas slit tapers in direction of its outer end.

8. A tool according to claim 1, further comprising at least two guiding means arranged at spaced locations to each other and extending vertically with respect to said supporting surface at a distance outside the gas slit.

9. A tool for the contact free support of plate-like substrates, comprising a flat plate-like body with at least one supporting surface, wherein at least one gas channel is provided within said body, extending from an outer gas supply end to an inner gas discharge end, said gas discharge end being in fluid communication with a gas distribution chamber, through which gas passes into a dynamically balanced gas slit being arranged predominately parallel to the supporting surface and opening into the supporting surface at its outer end at an angle $\alpha > 90$ and $< 180°$, wherein the gas distribution chamber and the gas slit are provided between a surface of a cavity within said body and a corresponding surface of a plate-like cover placed within said cavity, wherein spreaders are arranged between a bottom surface of the cover and a top surface of the cavity.

10. A tool according to claim 9, wherein said spreaders are designed as radially extending ribs.

11. A tool according to claim 9, wherein said spreaders are either part of the cover or of the body.

12. A tool for the contact free support of plate-like substrates, comprising a flat plate-like body with at least one supporting surface, wherein at least one gas channel is provided within said body, extending from an outer gas supply end to an inner gas discharge end, said gas discharge end being in fluid communication with a gas distribution chamber, through which gas passes into a dynamically balanced gas slit being arranged radially with respect to the gas distribution chamber, predominately parallel to the supporting surface and opening into the supporting surface at its outer end at an angle $\alpha > 90$ and $< 180°$, comprising a first and a second opposed supporting surface, at least two gas channels, two gas distribution chambers and two gas slits, the latter extending into said first and second supporting surface respectfully.

* * * * *